(12) United States Patent
Hebert (10) Patent No.: US 11,594,626 B2
(45) Date of Patent: Feb. 28, 2023

(54) BIDIRECTIONAL SWITCHES WITH ACTIVE SUBSTRATE BIASING

(71) Applicant: GLOBALFOUNDRIES U.S. Inc., Santa Clara, CA (US)

(72) Inventor: Francois Hebert, San Mateo, CA (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 171 days.

(21) Appl. No.: 17/168,593

(22) Filed: Feb. 5, 2021

(65) Prior Publication Data

US 2022/0254910 A1     Aug. 11, 2022

(51) Int. Cl.
*H01L 29/778*   (2006.01)
*H01L 21/762*   (2006.01)
*H01L 29/66*    (2006.01)
*H01L 29/40*    (2006.01)

(52) U.S. Cl.
CPC .... *H01L 29/7786* (2013.01); *H01L 21/76224* (2013.01); *H01L 29/405* (2013.01); *H01L 29/66462* (2013.01)

(58) Field of Classification Search
None
See application file for complete search history.

(56) References Cited

U.S. PATENT DOCUMENTS

| | | | | |
|---|---|---|---|---|
| 2009/0065810 A1* | 3/2009 | Honea | ............... | H01L 27/0605 257/192 |
| 2014/0374766 A1 | 12/2014 | Bahl et al. | | |
| 2017/0033187 A1* | 2/2017 | Rajan | ............... | H01L 29/868 |
| 2017/0110448 A1* | 4/2017 | Prechtl | ............... | H01L 27/0883 |
| 2019/0190517 A1* | 6/2019 | Leong | ............... | H03K 17/161 |
| 2020/0105741 A1* | 4/2020 | Lin | ............... | H01L 21/761 |

OTHER PUBLICATIONS

C. Kuring et al., "Impact of Substrate Termination on Dynamic On-State Characteristics of a Normally-off Monolithically Integrated Bidirectional GaN HEMT," 2019 IEEE Energy Conversion Congress and Exposition (ECCE), Baltimore, MD, USA, 2019, pp. 824-831, doi: 10.1109/ECCE.2019.8912793.
T. Morita et al., "650 V 3.1 mΩcm2 GaN-based monolithic bidirectional switch using normally-off gate injection transistor," 2007 IEEE International Electron Devices Meeting, Washington, DC, 2007, pp. 865-868, doi: 10.1109/IEDM.2007.4419086.
Roccaforte, F.; Greco, G.; Fiorenza, P.; Iucolano, F., "An Overview of Normally-Off GaN-Based High Electron Mobility Transistors", Materials Dec. 2019, 1599.

* cited by examiner

*Primary Examiner* — Khaja Ahmad
(74) *Attorney, Agent, or Firm* — Thompson Hine LLP; Anthony Canale (57) ABSTRACT

Structures for a bidirectional switch and methods of forming such structures. A substrate contact is formed in a trench defined in a substrate. A substrate includes a trench and a substrate contact in the trench. A bidirectional switch, which is on the substrate, includes a first source/drain electrode, a second source/drain electrode, an extension region between the first source/drain electrode and the second source/drain electrode, and a gate structure. A substrate-bias switch, which is on the substrate, includes a gate structure, a first source/drain electrode coupled to the substrate contact, a second source/drain electrode coupled to the first source/drain electrode of the bidirectional switch, and an extension region laterally between the gate structure and the first source/drain electrode.

20 Claims, 9 Drawing Sheets

BIDIRECTIONAL SWITCHES WITH ACTIVE SUBSTRATE BIASING

BACKGROUND

The present invention relates to semiconductor device fabrication and integrated circuits and, more specifically, to structures for a bidirectional switch and methods of forming such structures.

Bidirectional switches are used for AC-AC matrix converters, solar micro-inverters, battery management, and other power device applications. High-voltage power electronic devices, such as high-electron-mobility transistors, found in bidirectional switches may be fabricated using III-V compound semiconductors to exploit their material properties, such as a carrier mobility that is greater than the carrier mobility of silicon, and higher critical electric field strength than silicon, which enables higher-voltage operation with lower-drain-to-source resistance and smaller device size. III-V compound semiconductors include Group III elements (aluminum, gallium, indium) combined with Group V elements (nitrogen, phosphorus, arsenic, antimony). A high-electron-mobility transistor may include a heterojunction between crystalline III-V compound semiconductor materials having different band gaps, such as a heterojunction between binary gallium nitride and trinary aluminum-gallium nitride. During operation, a two-dimensional electron gas is generated near an interface at the heterojunction.

Unlike metal-oxide-semiconductor field-effect transistors, high-electron-mobility transistors lack a body diode from the source to drain that can be biased. The lack of a body diode is beneficial for switching applications because an improved bi-directional current flow can be achieved. However, existing bidirectional switches do not consider substrate biasing during device operation.

For certain switching applications, a pair of high-electron-mobility transistors can be connected in series to form a bidirectional switch. However, the series connection requires that each device be rated to one-half of the total desired switch resistance.

Improved structures for a bidirectional switch and methods of forming such structures are needed.

SUMMARY

In an embodiment of the invention, a structure includes a substrate having a trench and a substrate contact in the trench. A bidirectional switch, which is located on the substrate, includes a first source/drain electrode, a second source/drain electrode, an extension region between the first source/drain electrode and the second source/drain electrode, and a gate structure. A substrate-bias switch, which is also located on the substrate, includes a gate structure, a first source/drain electrode coupled to the substrate contact, a second source/drain electrode coupled to the first source/drain electrode of the bidirectional switch, and an extension region laterally between the gate structure and the first source/drain electrode.

In an embodiment of the invention, a method includes forming a first trench in a substrate, forming a first substrate contact in the first trench, forming a bidirectional switch on the substrate, and forming a substrate-bias switch on the substrate. The bidirectional switch includes a first source/drain electrode, a second source/drain electrode, an extension region between the first source/drain electrode and the second source/drain electrode, and a first gate structure. The substrate-bias switch includes a gate structure, a first source/drain electrode coupled to the substrate contact, a second source/drain electrode coupled to the first source/drain electrode of the bidirectional switch, and an extension region laterally between the gate structure and the first source/drain electrode.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
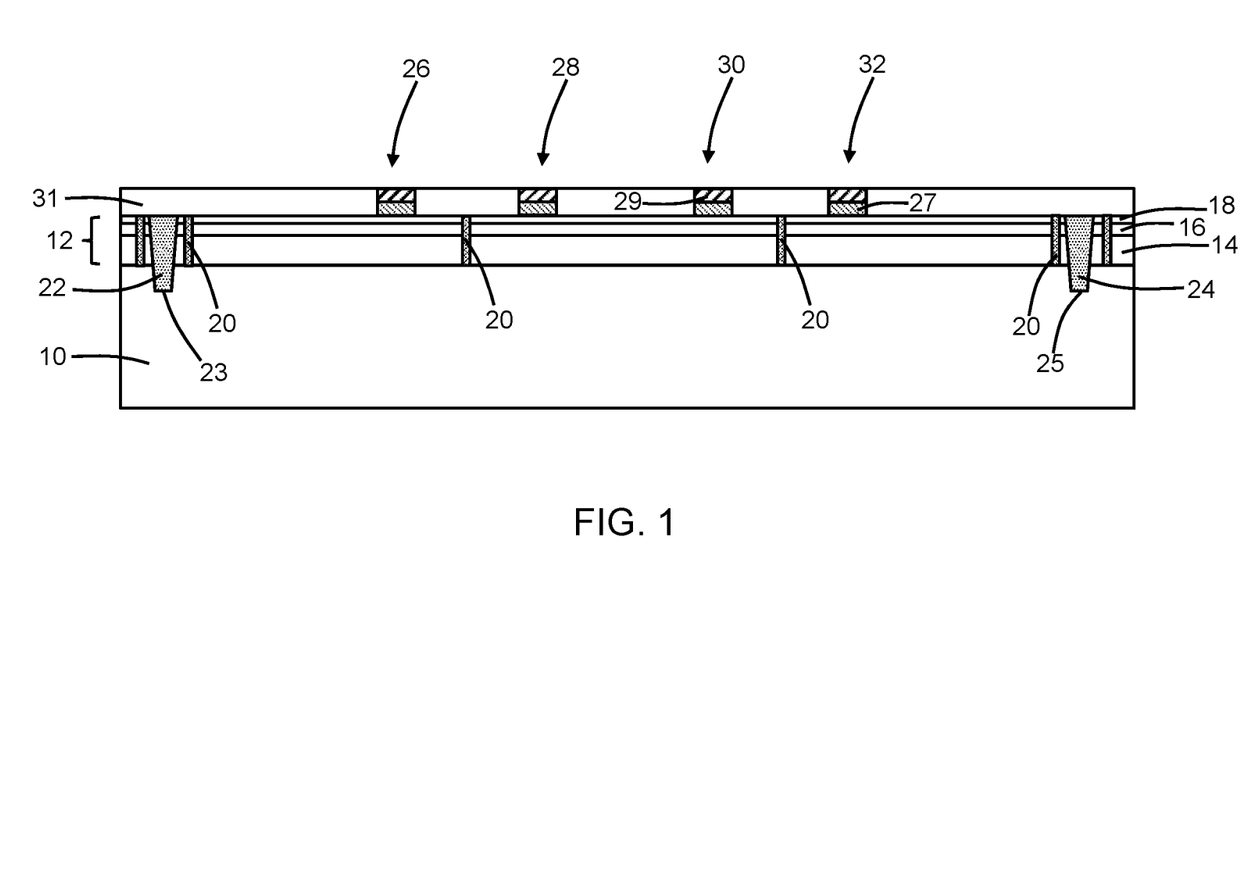
FIG. 1 is a cross-sectional view of a structure at an initial fabrication stage in accordance with embodiments of the invention.

With reference to FIG. 1 and in accordance with embodiments of the invention, a layer stack 12 is formed on a substrate 10. The substrate 10 may be a bulk substrate that contains a single-crystal semiconductor material (e.g., single-crystal silicon). In an embodiment, the single-crystal semiconductor material of the substrate 10 may be single-crystal silicon with a <111> crystal orientation. In other embodiments, the substrate 10 may be comprised of silicon carbide, sapphire, or gallium nitride.

The layer stack 12 may include a buffer layer 14, a channel layer 16, and a barrier layer 18 each containing one or more compound semiconductor layers. The layers 14, 16, 18 may be serially deposited using an epitaxial growth process, such as metalorganic chemical vapor deposition, vapor phase epitaxy, or molecular beam epitaxy, to form the layer stack. A nucleation layer (not shown) may be provided between the layer stack 12 and substrate 10. The layers 14, 16, 18 may each have a crystal structure that is single crystal or, alternatively, a crystal structure that is substantially single crystal with varying levels of crystalline defectivity present. The buffer layer 14 may contain a binary or ternary III-V compound semiconductor material, such as gallium nitride, aluminum nitride, aluminum gallium nitride, or a combination of these materials, that is tailored in terms of material composition, doping, and/or layer thickness to accommodate lattice mismatch, thermal property differences, and mechanical property differences between the material of the substrate 10 and the material of the channel layer 16. The channel layer 16, which is disposed over the buffer layer 14, may contain a binary III-V compound semiconductor material, such as gallium nitride, and may be undoped. The barrier layer 18, which is disposed over the channel layer 16, may contain a ternary III-V compound semiconductor, such as aluminum gallium nitride with 15 atomic percent aluminum to 35 atomic percent aluminum, that provides an heterogenous interface with the channel layer 16 of different composition. The barrier layer 18, along with the material properties of the channel layer 16, contribute to generating a two-dimensional electron gas, during device operation, at the interface between the layers 16, 18.

Isolation regions 20 are formed in the layer stack 12. The isolation regions 20 may be formed by, for example, a masked ion implantation of a species, such as nitrogen or argon. The isolation regions 20 may be used to terminate and localize the two-dimensional electron gas layer formed during operation. Alternatively, the isolation regions 20 may be trenches having a depth that is sufficient to penetrate through the two-dimensional electron gas layer formed during operation.

Substrate contacts 22, 24 are formed that extend through respective sections of the layers 14, 16, 18 of the layer stack 12 and into portions of the substrate 10 beneath the layer stack 12. The substrate contacts 22, 24, which are arranged at the periphery of the device structure, may be formed by patterning trenches 23, 25 with lithography and etching processes and filling the trenches 23, 25 with a planarized conductor, such as plugs containing tungsten or doped polysilicon. The substrate contacts 22, 24 are electrically isolated from the surrounding sections of the layers 14, 16, 18 of the layer stack 12 by the isolation regions 20.

Gate structures 26, 28, 30, 32 are formed on different portions of the layer stack 12. The gate structures 28 and 30 are laterally arranged between the gate structure 26 and the gate structure 32. The gate structures 26, 28, 30, 32 may include a gate 27 and a gate metal layer 29 positioned on and over the gate 27. Each gate 27 may be positioned in contact with the barrier layer 18 and, in an embodiment, each gate 27 may be in direct contact with the barrier layer 18. The gates 27 may be comprised of a doped III-V compound semiconductor, such as p-type gallium nitride or p-type aluminum-gallium-nitride doped with magnesium, and the gate metal layers 29 may be comprised of one or more metals, such as aluminum-copper, titanium nitride, titanium, etc.

The gates 27 may be formed by patterning a layer of doped III-V compound semiconductor (e.g., p-type gallium nitride) with lithography and etching processes, followed by the deposition of a dielectric layer 31 (e.g., silicon dioxide, aluminum oxide, or silicon nitride) to passivate the surface of the barrier layer 18 and line the sidewalls of the gates 27. Openings are patterned in the dielectric layer 31 at the locations of the gates 27, followed by depositing a layer of one or more metals, patterning with lithography and etching processes, and annealing to define the gate metal layers 29. A dielectric gate cap layer (not shown) may be formed over the gate structures 26, 28, 30, 32 and dielectric layer 31.

Figure 2:
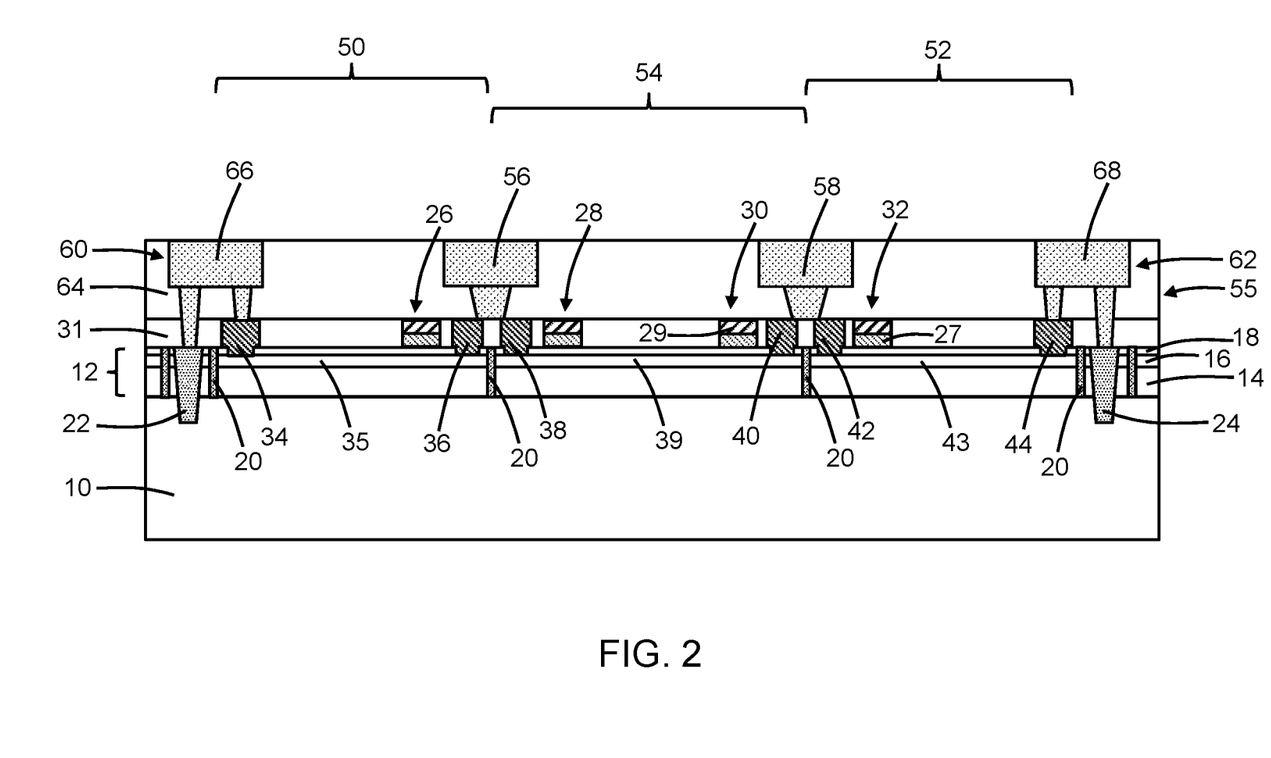
FIG. 2 is a cross-sectional view of the structure at a fabrication stage subsequent to FIG. 1.

With reference to FIG. 2 in which like reference numerals refer to like features in FIG. 1 and at a subsequent fabrication stage, source/drain electrodes 34, 36, 38, 40, 42, 44 are formed on different portions of the layer stack 12. The source/drain electrodes 34, 36, 38, 40, 42, 44 may comprise an ohmic metal, such as titanium, titanium nitride, aluminum, silicon, or a combination of these materials. The source/drain electrodes 34, 36, 38, 40, 42, 44 may be formed by patterning windows that extend through the dielectric layer 31 and optionally partially through the barrier layer 18, depositing a layer of the ohmic metal, patterning the deposited layer with lithography and etching processes, and annealing. The source/drain electrodes 34, 36, 38, 40, 42, 44 may be positioned in contact with the barrier layer 18 and, in an embodiment, may be in direct contact with the barrier layer 18. One of the isolation regions 20 is laterally positioned in the layer stack 12 between the source/drain electrode 36 and the source/drain electrode 38, and another of the isolation regions 20 is laterally positioned in the layer stack 12 between the source/drain electrode 40 and the source/drain electrode 42.

A substrate-bias switch 50, which provides substrate biasing, includes the source/drain electrode 34, the source/drain electrode 36, and the gate structure 26 that is laterally arranged between the source/drain electrode 34 and the source/drain electrode 36. In an embodiment, the source/drain electrode 34 may provide a drain of the substrate-bias switch 50 and the source/drain electrode 36 may provide a source of the substrate-bias switch 50. An extension region 35, which is provided by a section of the channel layer 16, is laterally positioned between the source/drain electrode 34 and the gate structure 26. The extension region 35 is electrically isolated by one of the isolation regions 20 from the section of the channel layer 16 through which the substrate contact 22 penetrates.

A substrate-bias switch 52, which provides substrate biasing, includes the source/drain electrode 42, the source/drain electrode 44, and the gate structure 32 that is laterally arranged between the source/drain electrode 42 and the source/drain electrode 44. In an embodiment, the source/drain electrode 44 may provide a drain of the substrate-bias switch 52 and the source/drain electrode 42 may provide a source of the substrate-bias switch 52. An extension region 43, which is provided by a section of the channel layer 16, is laterally positioned between the source/drain electrode 42 and the source/drain electrode 44. The extension region 43 is electrically isolated by one of the isolation regions 20 from the section of the channel layer 16 through which the substrate contact 24 penetrates. The substrate-bias switch 52 is structurally similar to the substrate-bias switch 50.

A bidirectional switch 54, which may provide bidirectional switching, includes the source/drain electrode 38, the source/drain electrode 40, and the gate structures 28, 30 that are laterally arranged between the source/drain electrode 38 and the source/drain electrode 40. An extension region 39, which is provided by a section of the channel layer 16, is laterally positioned between the source/drain electrode 38 and the source/drain electrode 40. The gate structures 28 and 30 are separated by a distance sufficient to support the operating voltage of the bidirectional switch 54 when operating as a switch. The bidirectional switch 54 may operate in enhancement mode in which requires the application of a positive bias voltage to either the gate structure 28 or the gate structure 30 to change the directionality.

The source/drain electrodes 34, 36, 38, 40, 42, 44 may include optional field plates (not shown) that overlap with the respective extension regions 35, 39, 43. The gate metal layers 29 may include optional field plates (not shown) formed by extending the gate metal over the respective extension regions, or by adding additional metal layers that overlap the respective extension regions 35, 39, 43.

Middle-of-line processing and back-end-of-line processing follow, which includes formation of contacts, vias, and wiring for the metallization levels of an interconnect structure that is positioned over the substrate 10 and that is coupled to the substrate-bias switches 50, 52 and bidirectional switch 54. In that regard, the source/drain electrode 36 of the substrate-bias switch 50 and the source/drain electrode 38 of the bidirectional switch 54 are both coupled physically and electrically to a metal feature 56 in a metallization level 55 of the interconnect structure. The source/drain electrode 42 of the substrate-bias switch 52 and the source/drain electrode 40 of the bidirectional switch 54 are both coupled physically and electrically to a metal feature 58 in the metallization level 55 of the interconnect structure. Vias and a metal feature 66 define an interconnect 60 in the metallization level 55 of the interconnect structure that couples the source/drain electrode 34 of the substrate-bias switch 50 with the substrate contact 22. Vias and a metal feature 68 define an interconnect 62 in the metallization level 55 of the interconnect structure that couples the source/drain electrode 44 of the substrate-bias switch 52 with the substrate contact 24.

In an embodiment, the metal features 56, 58 and interconnects 60, 62 may be included in a first metallization (M1) level of the interconnect structure that is closest to the substrate 10. The metal features 56, 58 and interconnects 60, 62 may be formed in one or more dielectric layers 64 comprised of, for example, silicon dioxide and/or silicon nitride. Additional metallization levels of the interconnect structure may be formed over the M1 level, and a topmost metallization level may include bond pads.

Figure 3:
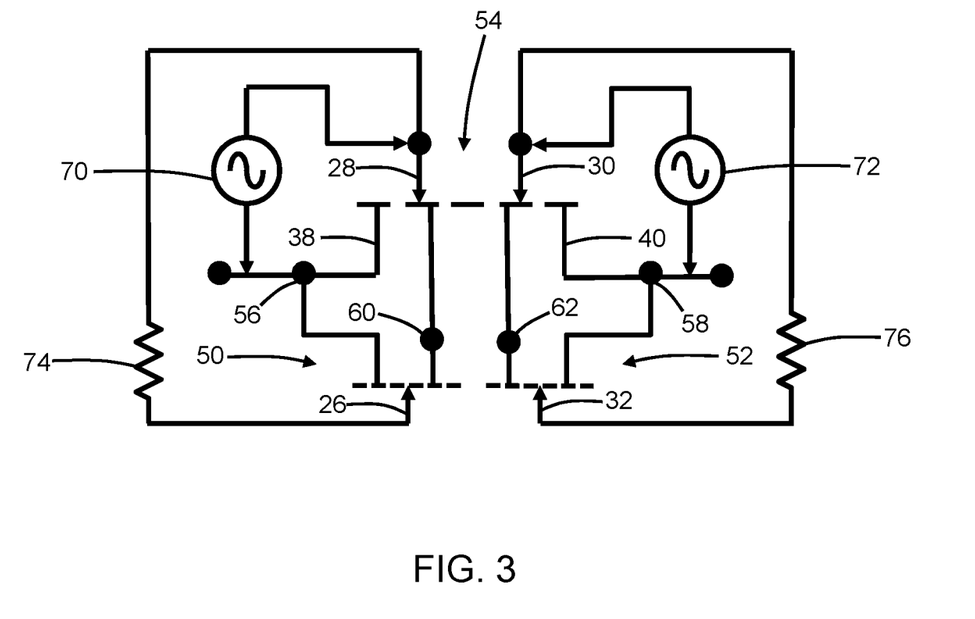
FIG. 3 is a circuit schematic of the structure of FIG. 2.

With reference to FIGS. 2 and 3 and in accordance with embodiments of the invention, the substrate-bias switches 50, 52 and bidirectional switch 54 may be utilized in a circuit to provide a lateral bidirectional switch that couples a power device 70 and a power device 72. The power device 70 is coupled with the gate structure 28 of the bidirectional switch 54, and the power device 72 is coupled with the gate structure 30 of the bidirectional switch 54. In an embodiment, the power devices 70, 72 may be alternating-current (AC) power supplies.

Figure 4:
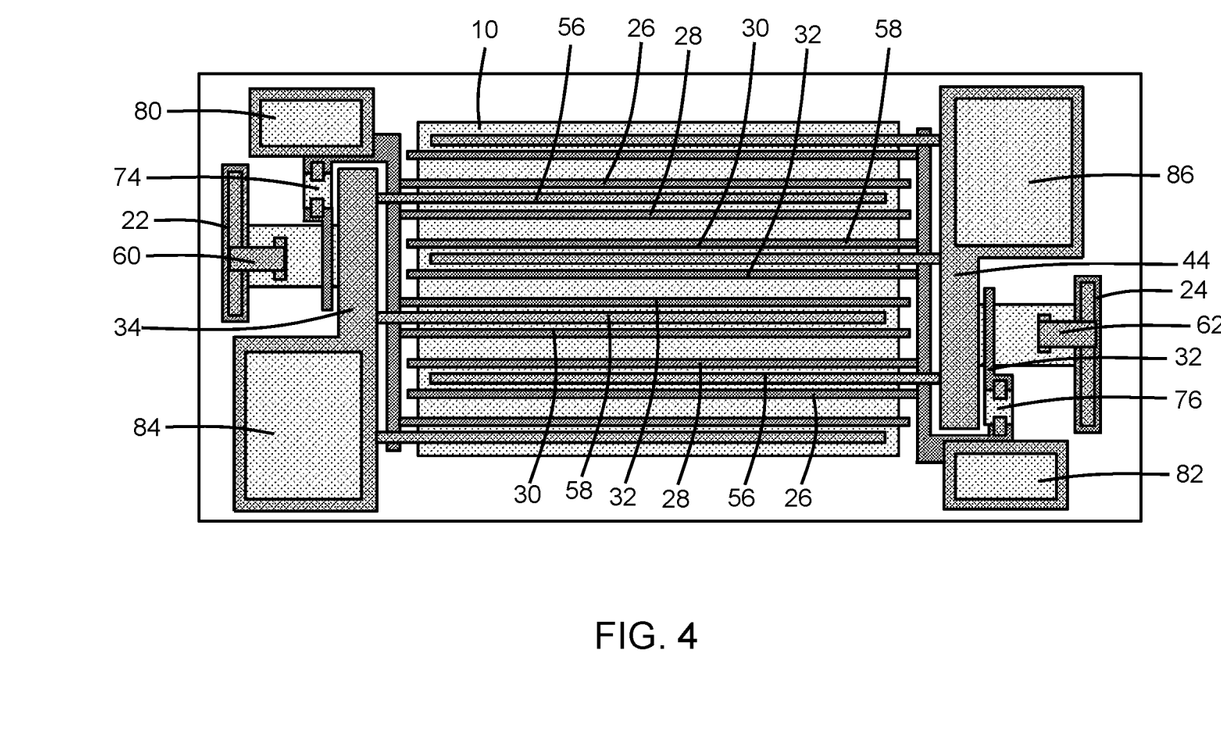
FIG. 4 is a layout view of a structure in accordance with embodiments of the invention.

The substrate-bias switches 50, 52 provide active substrate biasing during the operation of the bidirectional switch 54 that is internal and that lacks external connections. In that regard, the gate structure 26 of the substrate-bias switch 52 is coupled to the gate structure 28 of the bidirectional switch 54, and the gate structure 32 of the substrate-bias switch 52 is coupled to the gate structure 30 of the bidirectional switch 54. The gate coupling may be achieved by a U-shaped gate structure in which the gate structures 26, 28 are arms and another U-shaped gate structure in which the gate structures 30, 32 are arms, as best shown in FIG. 4.

The substrate 10 is biased via the substrate contact 22, if the gate structures 26, 28 are biased in the "on" state during operation, by a current supplied from the source/drain electrode 36 in an internal connection that includes the channel beneath the gate structure 26, the extension region 35, the source/drain electrode 34, and the interconnect 60. The substrate 10 is biased via the substrate contact 24, if the gate structures 30, 32 are biased in the "on" state during operation, by a current supplied from the source/drain electrode 42 in an internal connection that includes the channel beneath the gate structure 32, the extension region 43, the source/drain electrode 44, and the interconnect 62.

In an embodiment, a gate resistor 74 may be provided that is coupled in series with the gate structures 26, 28, and a gate resistor 76 may be provided that is coupled in series with the gate structures 30, 32. The gate resistor 74 may be utilized to adjust the turn-on speed of the substrate-bias switch 50, and gate resistor 76 may be utilized to adjust the turn-on speed of the substrate-bias switch 52. In an alternative embodiment, the gate resistors 74, 76 may be omitted.

In an embodiment, the source/drain electrode 36 defines a source of the substrate-bias switch 50 that is coupled to the source/drain electrode 38, which provides either a source or a drain of the bidirectional switch 54 contingent on the direction of current flow between the power devices 70, 72, and the source/drain electrode 34 defines a drain of the substrate-bias switch 50 that is coupled to the substrate contact 22 by the interconnect 60. In an embodiment, the source/drain electrode 42 defines a source of the substrate-bias switch 52 that is coupled to the source/drain electrode 40, which provides either a source or a drain of the bidirectional switch 54 contingent on the direction of current flow between the power devices 70, 72, and the source/drain electrode 44 defines a drain of the substrate-bias switch 52 that is coupled to the substrate contact 24 by the interconnect 62.

With reference to FIG. 4 in which like reference numerals refer to like features in FIG. 2 and in accordance with embodiments of the invention, the bidirectional switch 54 may include multiple gate structures 26, 28 that are arranged as gate fingers and multiple gate structures 30, 32 that are also arranged as gate fingers. The multiple gate structures 26, 28 may have a parallel arrangement and may be commonly connected at one end. The multiple gate structures 26, 28 are commonly coupled to a bond pad 80 in the interconnect structure. The multiple gate structures 30, 32 may have a parallel arrangement and may be commonly connected at one end. The multiple gate structures 30, 32 are commonly coupled to a bond pad 82 in the interconnect structure.

Metal features 56 are arranged between the gate structures 26, 28 with source/drain electrodes arranged beneath each metal feature 56, as illustrated by the source/drain electrodes 36, 38 beneath the metal features 56 in FIG. 2. Metal features 58 are arranged between the gate structures 30, 32 with source/drain electrodes arranged beneath each metal feature 58, as illustrated by the source/drain electrodes 40, 42 beneath the metal features 58 in FIG. 2. The metal features 56 are commonly coupled to a bond pad 84 in the interconnect structure. The metal features 58 are commonly coupled to a bond pad 86 in the interconnect structure. The gate resistors 74, 76, which are optional, may be provided by portions of the substrate 10.

Figure 5:
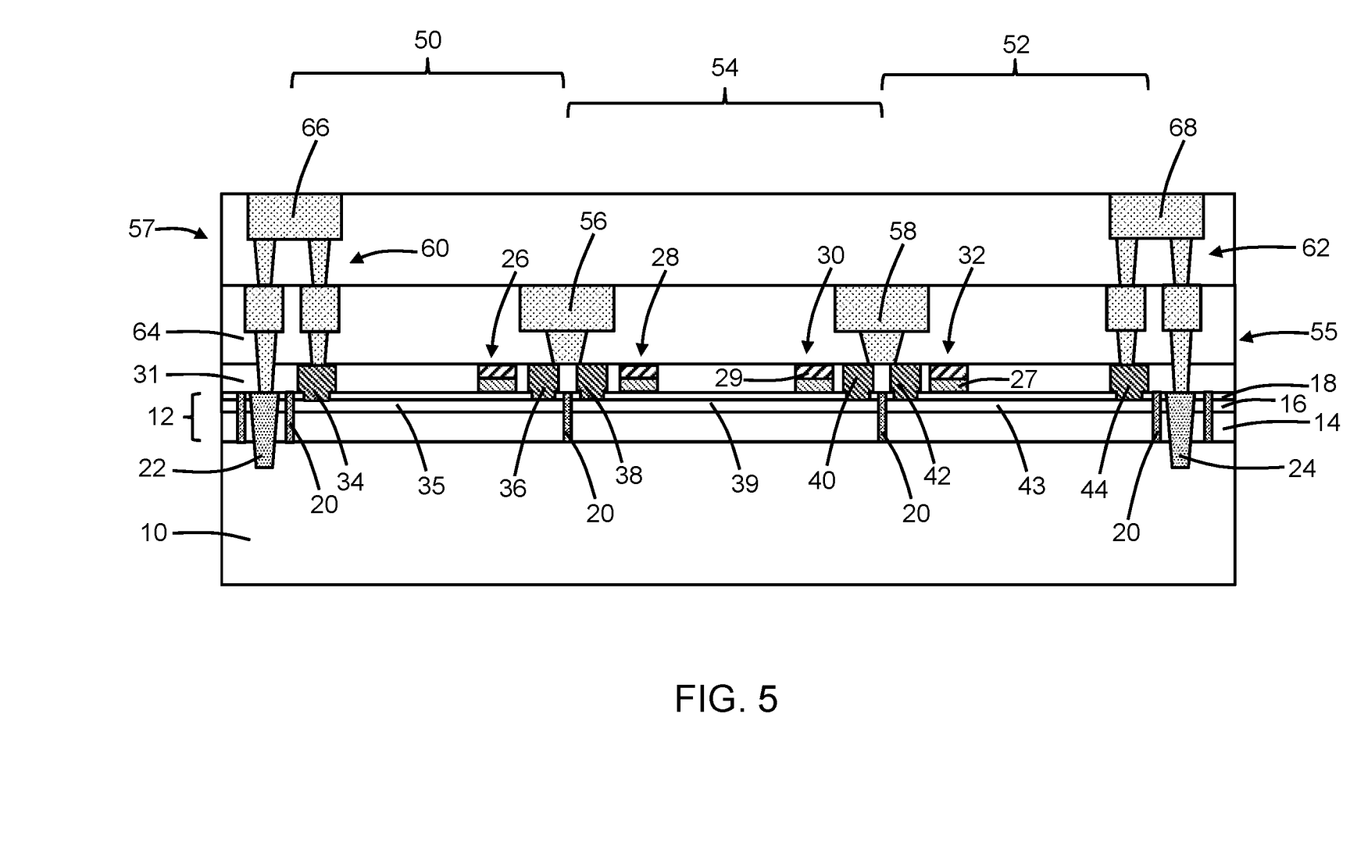
FIGS. 5-8 are cross-sectional views of structures in accordance with embodiments of the invention.

With reference to FIG. 5 in which like reference numerals refer to like features in FIG. 2 and in accordance with alternative embodiments of the invention, the metal feature 66 of the interconnect 60 and the metal feature 68 of the interconnect 62 may be formed in a metallization level 57 that is arranged over the metallization level 55 in the interconnect structure. In an embodiment, the metallization level 57 may be a second metallization (M2) level of the interconnect structure that is separated from the substrate 10 by only the M1 level of the interconnect structure. Placement of the metal features 56, 58 of the interconnects 60, 62 in the M2 level above the M1 level may be beneficial for higher voltage (e.g., voltages greater than 200 volts) applications.

Figure 6:
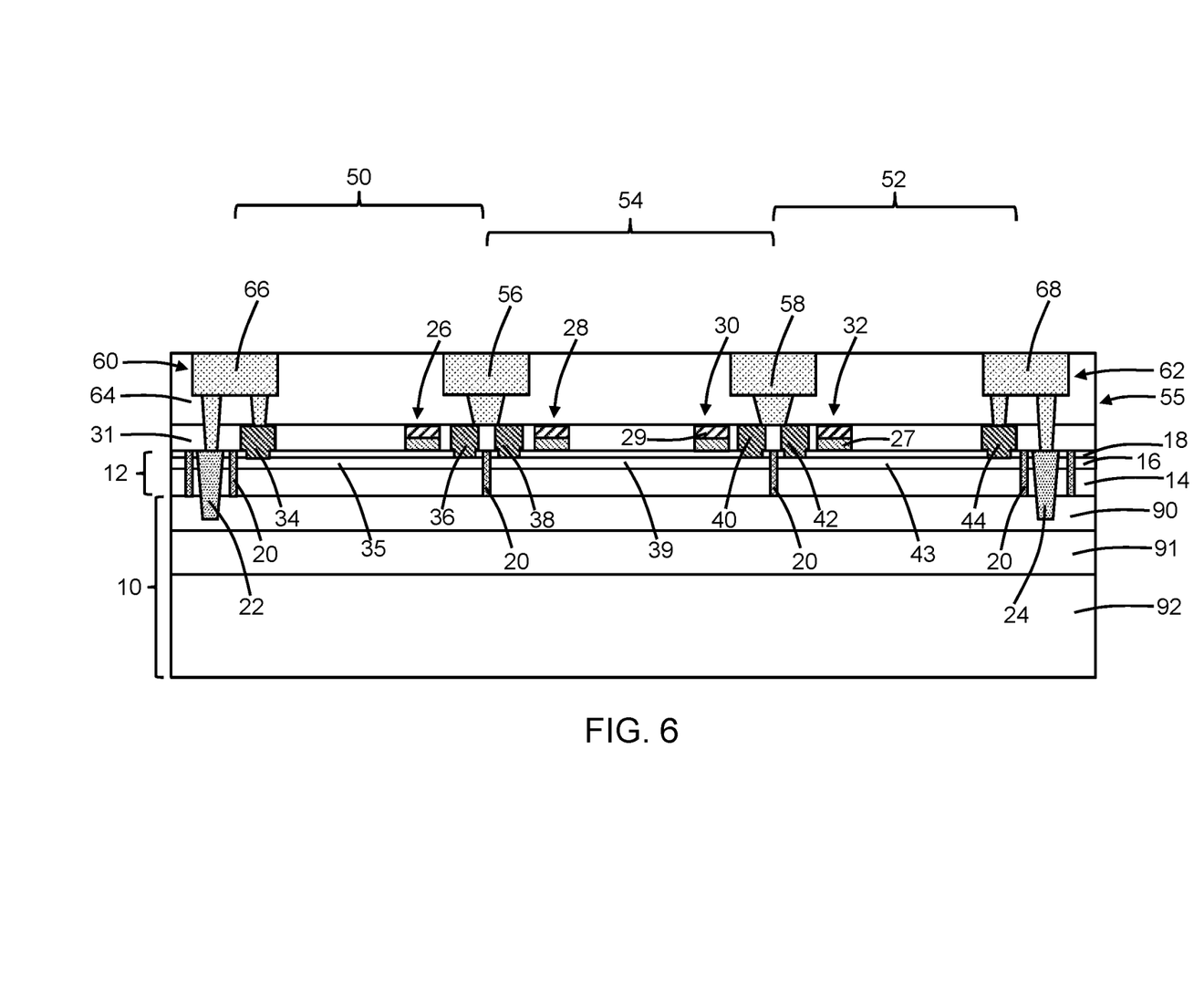

With reference to FIG. 6 in which like reference numerals refer to like features in FIG. 2 and in accordance with alternative embodiments of the invention, the substrate 10 may be a silicon-on-insulator substrate that includes a device layer 90, a buried oxide layer 91, and a handle substrate 92 separated from the device layer 90 by the buried oxide layer 91. The device layer 90 may be comprised of single-crystal semiconductor material (e.g., single-crystal silicon), and may operate as a seed layer for growth of the layer stack 12. The buried oxide layer 91 may be comprised of silicon dioxide, and the handle substrate 92 may be comprised of single-crystal silicon.

Figure 7:
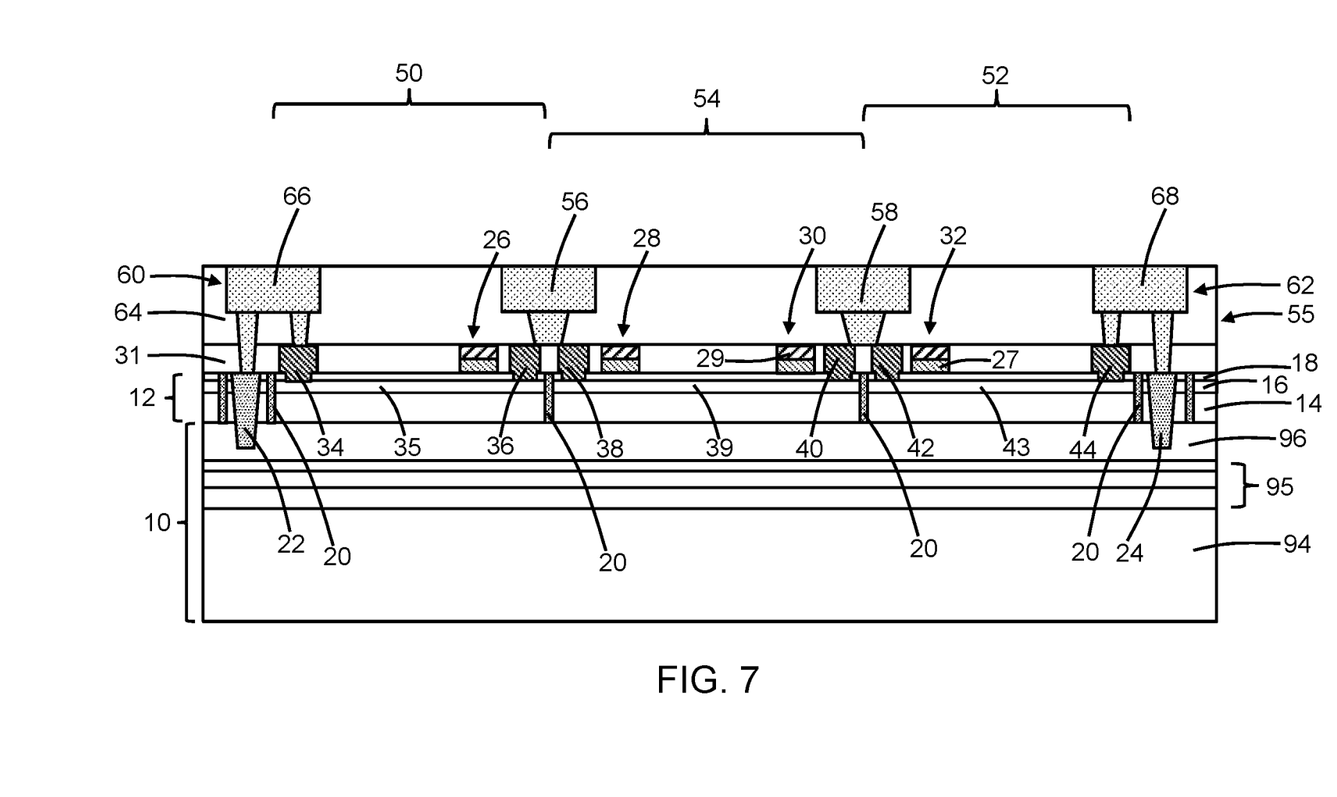

With reference to FIG. 7 in which like reference numerals refer to like features in FIG. 2 and in accordance with alternative embodiments of the invention, the substrate 10 may be an engineered substrate that includes a handle substrate 94 comprised of a polycrystalline ceramic material that is closely matched to the thermal expansion characteristics of the materials of the layer stack 12. In an embodiment, the handle substrate 94 may be comprised of polycrystalline aluminum nitride, which is closely matched to the thermal expansion characteristics of gallium nitride. In an embodiment, the handle substrate 94 may be comprised of polycrystalline silicon carbide, which is also closely matched to the thermal expansion characteristics of gallium nitride. The handle substrate 94 is covered by a layer stack 95 including engineered layers, such as layers comprised of silicon dioxide, silicon nitride, polysilicon, etc. The layer stack 95 is capped by a seed layer 96 tailored for growth of the layer stack 12. In embodiments, the seed layer 96 may be comprised of single-crystal <111>-oriented silicon, single-crystal gallium nitride, or single crystal silicon carbide. In the representative embodiment, the substrate contacts 22, 24 extend into the seed layer 96 and are coupled to the seed layer 96.

Figure 8:
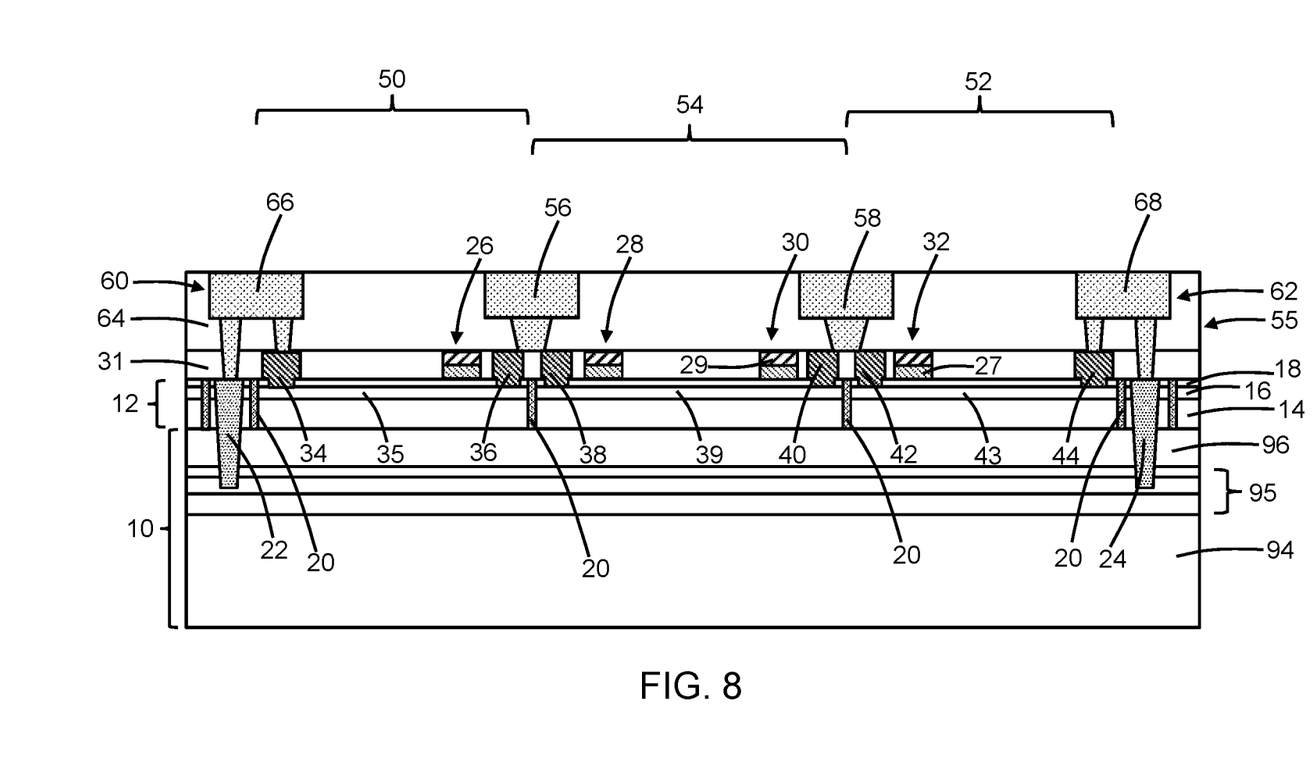

With reference to FIG. 8 in which like reference numerals refer to like features in FIG. 7 and in accordance with alternative embodiments of the invention, the substrate contacts 22, 24 may penetrate through the seed layer 96 and into the layer stack 95 of engineered layers. Due to their penetration through the seed layer 96, the substrate contacts 22, 24 are coupled to the seed layer 96.

Figure 9:
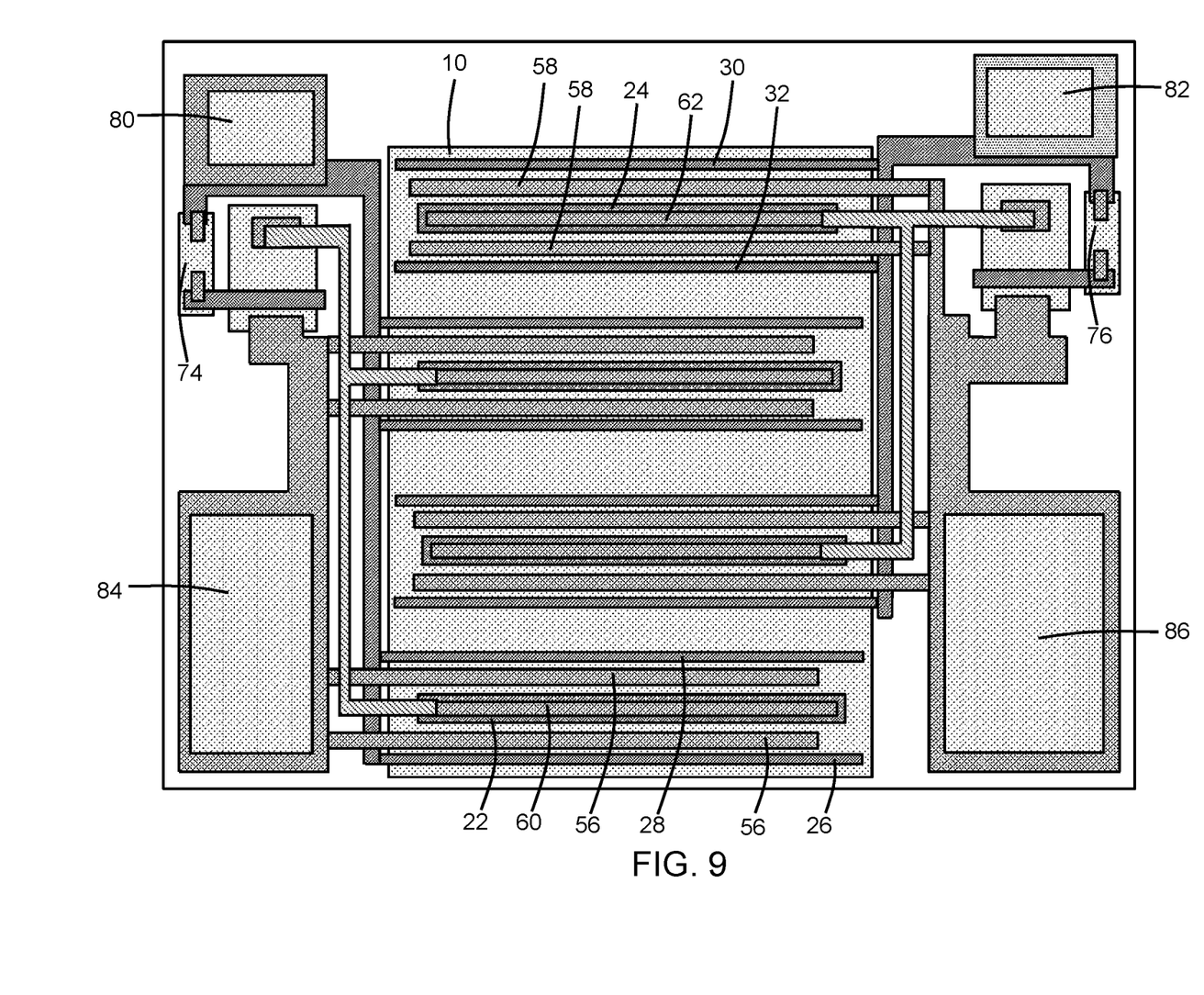
FIG. 9 is a layout view of a structure in accordance with embodiments of the invention.

With reference to FIG. 9 in which like reference numerals refer to like features in FIG. 4 and in accordance with alternative embodiments of the invention, the substrate contacts 22, 24 may be relocated to positions that are adjacent to source/drain electrodes that are beneath the metal features 56, as illustrated by the source/drain electrodes 36, 38 beneath the metal features 56 in FIG. 2, and adjacent to source/drain electrodes that are beneath the metal features 58, as illustrated by the source/drain electrodes 40, 42 beneath the metal features 58 in FIG. 2.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a substrate including a first trench;
    a first substrate contact in the first trench;
    a bidirectional switch on the substrate, the bidirectional switch including a first source/drain electrode, a second source/drain electrode, an extension region between the first source/drain electrode and the second source/drain electrode, and a first gate structure; and
    a first substrate-bias switch on the substrate, the first substrate-bias switch including a gate structure, a first source/drain electrode coupled to the first substrate contact, a second source/drain electrode coupled to the first source/drain electrode of the bidirectional switch, and an extension region laterally between the gate structure and the first source/drain electrode.

2. The structure of claim 1 wherein the substrate includes a handle substrate comprised of a polycrystalline ceramic material, a layer stack of engineered layers on the handle substrate, and a seed layer on the layer stack of engineered layers, and the first substrate contact is coupled to the seed layer.

3. The structure of claim 1 wherein the first substrate contact is coupled to the substrate, and the substrate comprises silicon.

4. The structure of claim 1 wherein the substrate includes a device layer, a buried oxide layer, and a handle substrate separated from the device layer by the buried oxide layer, and the first substrate contact is coupled to the device layer.

5. The structure of claim 1 wherein the extension region of the bidirectional switch is a first section of a III-V semiconductor layer, the extension region of the first substrate-bias switch is a second section of the III-V semiconductor layer, and the first substrate contact extends through a third section of the III-V semiconductor layer and into the substrate.

6. The structure of claim 5 further comprising:
    an isolation region laterally positioned in the III-V semiconductor layer between the second section of the III-V semiconductor layer and the third section of the III-V semiconductor layer.

7. The structure of claim 1 wherein the first substrate contact is positioned adjacent to the first source/drain electrode of the bidirectional switch.

8. The structure of claim 1 wherein the gate structure of the first substrate-bias switch is coupled to the first gate structure of the bidirectional switch.

9. The structure of claim 8 further comprising:
a gate resistor coupled in series with the gate structure of the first substrate-bias switch and the first gate structure of the bidirectional switch.

10. The structure of claim 1 wherein the substrate includes a second trench, and further comprising:
a second substrate contact in the second trench; and
a second substrate-bias switch on the substrate, the second substrate-bias switch including a gate structure, a first source/drain electrode coupled to the second substrate contact, a second source/drain electrode coupled to the second source/drain electrode of the bidirectional switch, and an extension region laterally between the gate structure and the first source/drain electrode.

11. The structure of claim 10 wherein the bidirectional switch includes a second gate structure, the gate structure of the first substrate-bias switch is coupled to the first gate structure of the bidirectional switch, and the gate structure of the second substrate-bias switch is coupled to the second gate structure of the bidirectional switch.

12. The structure of claim 1 further comprising:
an interconnect structure that includes an interconnect coupling the first source/drain electrode to the first substrate contact.

13. The structure of claim 12 wherein the interconnect structure includes a metallization level positioned that is closest to the substrate, and the interconnect includes a metal feature positioned in the metallization level.

14. The structure of claim 12 wherein the interconnect structure includes a first metallization level and a second metallization level, the first metallization level is positioned between the second metallization level and the first substrate contact, and the interconnect includes a metal feature positioned in the second metallization level.

15. The structure of claim 1 wherein the extension region of the bidirectional switch and the extension region of the first substrate-bias switch are comprised of gallium nitride.

16. A method comprising:
forming a first trench in a substrate;
forming a first substrate contact in the first trench;
forming a bidirectional switch on the substrate, wherein the bidirectional switch includes a first source/drain electrode, a second source/drain electrode, an extension region between the first source/drain electrode and the second source/drain electrode, and a first gate structure; and
forming a first substrate-bias switch on the substrate, wherein the first substrate-bias switch includes a gate structure, a first source/drain electrode coupled to the first substrate contact, a second source/drain electrode coupled to the first source/drain electrode of the bidirectional switch, and an extension region laterally between the gate structure and the first source/drain electrode.

17. The method of claim 16 wherein a second trench is formed in the substrate, and further comprising:
forming a second substrate contact in the second trench; and
forming a second substrate-bias switch on the substrate, wherein the second substrate-bias switch includes a gate structure, a first source/drain electrode coupled to the second substrate contact, a second source/drain electrode coupled to the second source/drain electrode of the bidirectional switch, and an extension region laterally between the gate structure and the first source/drain electrode.

18. The method of claim 17 wherein the bidirectional switch includes a second gate structure, the gate structure of the first substrate-bias switch is coupled to the first gate structure of the bidirectional switch, and the gate structure of the second substrate-bias switch is coupled to the second gate structure of the bidirectional switch.

19. The method of claim 16 further comprising:
forming an interconnect structure that includes an interconnect coupling the first source/drain electrode to the first substrate contact.

20. The method of claim 16 wherein the extension region of the bidirectional switch is a first section of a III-V semiconductor layer, the extension region of the first substrate-bias switch is a second section of the III-V semiconductor layer, the first substrate contact extends through a third section of the III-V semiconductor layer and into the substrate, and further comprising:
forming an isolation region laterally positioned in the III-V semiconductor layer between the second section of the III-V semiconductor layer and the third section of the III-V semiconductor layer.

* * * * *

UNITED STATES PATENT AND TRADEMARK OFFICE
CERTIFICATE OF CORRECTION

| | | |
|---|---|---|
| PATENT NO. | : 11,594,626 B2 | Page 1 of 2 |
| APPLICATION NO. | : 17/168593 | |
| DATED | : February 28, 2023 | |
| INVENTOR(S) | : Francois Hebert | |

It is certified that error appears in the above-identified patent and that said Letters Patent is hereby corrected as shown below:

In the Drawings

Replace FIG. 4 as shown on the attached drawing sheet.

Signed and Sealed this
Thirtieth Day of September, 2025

John A. Squires
*Director of the United States Patent and Trademark Office*

FIG. 4